United States Patent
Hsin et al.

(10) Patent No.: US 7,196,322 B1
(45) Date of Patent: Mar. 27, 2007

(54) IMAGE SENSOR PACKAGE

(75) Inventors: Chung Hsien Hsin, Hsinchu Hsien (TW); Figo Hsieh, Hsinchu Hsien (TW); Wei Chang, Hsinchu Hsien (TW)

(73) Assignee: Kingpak Technology Inc., Hsinchu Hsien (TW)

( * ) Notice: Subject to any disclaimer, the term of this patent is extended or adjusted under 35 U.S.C. 154(b) by 249 days.

(21) Appl. No.: 10/961,649

(22) Filed: Oct. 8, 2004

(51) Int. Cl.
*H01L 23/00* (2006.01)

(52) U.S. Cl. .................. 250/239; 250/208.1; 250/216; 257/432; 257/433; 359/829

(58) Field of Classification Search ............... None
See application file for complete search history.

(56) References Cited

U.S. PATENT DOCUMENTS

| | | | | |
|---|---|---|---|---|
| 6,359,740 B1 * | 3/2002 | Tsuchiya | ................ | 359/819 |
| 6,483,101 B1 * | 11/2002 | Webster | ................ | 250/216 |
| 6,727,431 B2 * | 4/2004 | Hashimoto | ................ | 174/52.2 |
| 2004/0041088 A1 * | 3/2004 | Chen | ................ | 250/239 |

\* cited by examiner

*Primary Examiner*—David Porta
*Assistant Examiner*—Davienne Monbleau
(74) *Attorney, Agent, or Firm*—Pro-Techtor Int'l Services

(57) ABSTRACT

An image sensor module includes a substrate, frame layer, a photosensitive chip, a lens holder, and a lens barrel. The substrate has an upper surface, and a lower surface on which second electrodes are formed. The frame layer is arranged on the upper surface of the substrate, a cavity formed between the frame layer and substrate. The photosensitive chip is mounted on the upper surface of the substrate and located within the cavity. The lens holder has an upper end face, a lower upper face, and an opening penetrating through the lens holder from the upper end face to the lower end face, the upper end of the opening is formed with an internal thread and the lower end of the opening is formed with a breach, so that the internal diameter of the upper end of the opening is smaller than the lower end of the opening, the lens holder is adhered on the upper surface of the substrate by glue, therefore, the frame layer is located within the breach of the lens holder. The lens barrel has an upper end face, a lower end face, and an external thread is screwed to the internal thread of the lens holder.

5 Claims, 2 Drawing Sheets

IMAGE SENSOR PACKAGE

BACKGROUND OF THE INVENTION

1. Field of the Invention

The invention relates to an image sensor module, and in particular to an image sensor module is capable of manufacturing to be light, thin, and small.

2. Description of the Related Art

Referring to FIG. 1, it is a conventional image sensor module includes a substrate 10, photosensitive chip 20, a lens holder 24, and a lens barrel 32. The substrate 10 has an upper surface 12 on which first electrodes 16 are formed, and a lower surface 14 on which second electrodes 18 are formed. The photosensitive chip 20 is mounted on the upper surface 12 of the substrate 10, and is electrically connected to the first electrodes 16 of the substrate 11. The lens holder 24 has an upper end face 26, a lower upper face 28, and an opening penetrating through the lens holder 24 from the upper end face 26 to the lower end face 28. The upper end of the opening is formed with an internal thread 30, the lens holder 24 is adhered on the upper surface 12 of the substrate 10 by glue, therefore, the photosensitive chip 20 is located within the opening of the lens holder 24. The lens barrel 32 has an upper end face 34, a lower end face 36, and an external thread 38 screwed to the internal thread 30 of the lens holder 24.

Accordingly, when the photosensitive chip 20 has a large scale, it is inconvenient, or even impossible, in the manufacturing processes for bonding and electrically connecting wires to the first electrodes 16 of the substrate 10. Therefore, the size of the substrate 10 has to be enlarge so as to increase the space for wire bonding.

SUMMARY OF THE INVENTION

An objective of the invention is to provide an image sensor module, that is ease to be package and capable of reducing the volume of the module and the manufacturing cost.

Another objective of the invention is to provide an image sensor module capable of packaging image sensor chip having different sizes without changing the package volume. The objective of the producing packages having the same volume can be achieved.

To achieve the above-mentioned object, the invention provides a substrate, a frame layer, a photosensitive chip, a lens holder, and a lens barrel. The substrate has an upper surface and a lower surface. The frame layer is arranged on the upper surface of the substrate, a cavity formed between the frame layer and substrate. The photosensitive chip is mounted on the upper surface of the substrate and located within the cavity. The lens holder has an upper end face, a lower upper face, and an opening penetrating through the lens holder from the upper end face to the lower end face, the upper end of the opening is formed with an internal thread and the lower end of the opening is formed with a breach, so that the internal diameter of the upper end of the opening is smaller than the lower end of the opening, the lens holder is adhered on the upper surface of the substrate by glue, therefore, the frame layer is located within the breach of the lens holder. The lens barrel has an upper end face, a lower end face, and an external thread is screwed to the internal thread of the lens holder.

DETAILED DESCRIPTION OF THE INVENTION

Figure 1:
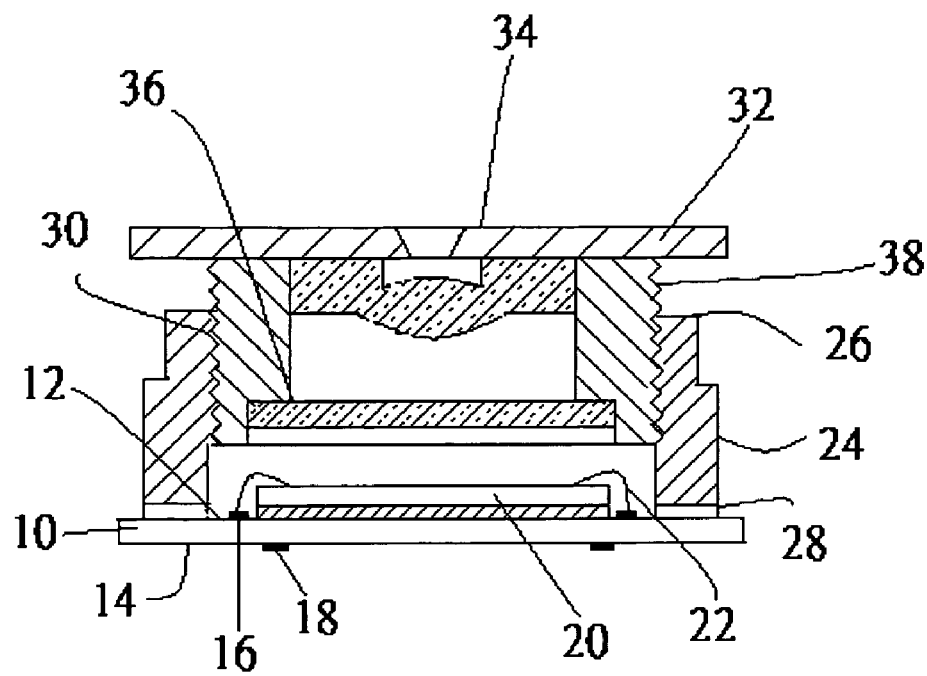
FIG. 1 is a cross-sectional view showing a conventional image sensor module.
Figure 2:
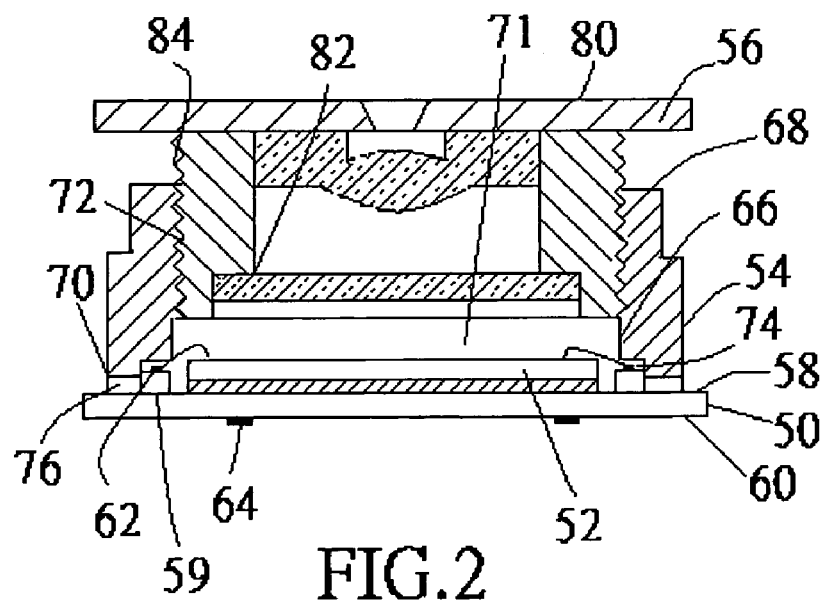
FIG. 2 is a cross-sectional view showing an image sensor module of the present invention.

Please refer to FIG. 2 is an image sensor module of the present invention includes a substrate 50, a frame layer 59, a photosensitive chip 52, a lens holder 54, and a lens barrel 56.

Figure 3:
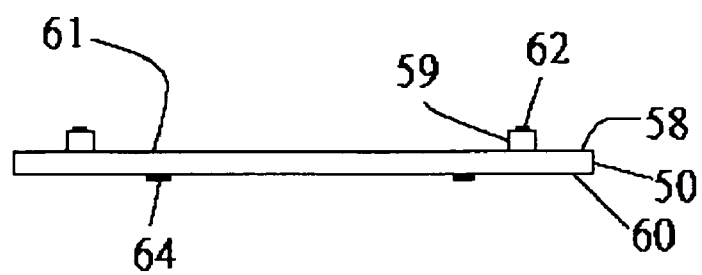
FIG. 3 is a cross-section view showing a substrate of the image sensor module.

Please refer to FIG. 3. The substrate 50 has an upper surface 58 and a lower surface 60 on which a plurality of second electrodes 64 are formed.

The frame layer 59 is arranged on the upper surface 58 of the substrate 50, a cavity 61 is formed between the frame layer 59 and substrate 50, a plurality of first electrodes 62 are formed on the frame layer 59.

The photosensitive chip 52 is mounted on the upper surface 58 of the substrate 50, and is located within the cavity 61, then, the photosensitive chip 52 is electrically connected to the first electrodes 62 of the frame layer 59 by wires 66.

The lens holder 54 has an upper end face 68, a lower end face 70, and an opening 71 penetrating through the lens holder 54. The upper end of the opening 71 is formed with an internal thread 72, and the lower end of the opening 71 is formed with a breach 74. So that the internal diameter of the upper end of the opening 71 is smaller than the lower end of the opening 71, in the embodiment, the breach 74 of the opening 71 is a triangular form. The lens holder 54 is adhered on the upper surface 58 of the substrate 50 by glue 76. Therefore, the frame layer 59 is located within the beach 74 of the lens holder 54.

The lens barrel 56 has an upper end face 80, a lower end face 82, and an external thread 84 screwed to the internal thread 72 of the lens holder 54.

Therefore, it is possible to select the substrate 50 having a smaller size to package the photosensitive chip 52 having the same original size. Thus, it is possible to obtain an image sensor module having smaller volume and to decrease the material costs for the substrate 50.

While the invention has been described by way of an example and in terms of a preferred embodiment, it is to be understood that the invention is not limited to the disclosed embodiment. On the contrary, it is intended to cover various modifications. Therefore, the scope of the appended claims should be accorded the broadest interpretation so as to encompass all such modifications.

What is claimed is:

1. An image sensor module, the structure comprising:
    a substrate having an upper surface, and a lower surface on which second electrodes are formed;
    a frame layer arranged on the upper surface of the substrate, a cavity formed between the frame layer and substrate, and a plurality of first electrodes are formed on the frame layer;
    a photosensitive chip mounted on the upper surface of the substrate and located within the cavity, and electrically connected to the first electrodes of the frame later;

a lens holder having an upper end face, a lower end face, and an opening penetrating through the lens holder from the upper end face to the lower end face, the upper end of the opening formed with an internal thread and the lower end of the opening formed with a breach, so that the internal diameter of the upper end of the opening is smaller than the lower end of the opening, the lens holder adhered on the upper surface of the substrate by glue, wherein, the frame layer is located within the breach of the lens holder; and a lens barrel having an upper end face, a lower end face, and an external thread screwed to the internal thread of the lens holder.

2. The image sensor module according to claim 1, wherein the photosensitive chip is electrically connected to the plurality of first electrodes of the substrate by wires.

3. The image sensor module according to claim 2, wherein the wires are located within the breach of the lens holder.

4. The image sensor module according to claim 1, wherein the breach of the opening is triangular form.

5. The image sensor module according to claim 1, wherein the size of the frame layer is same as that of the lower end face of the opening of the lens holder.

* * * * *